US008330955B2

(12) United States Patent
Clark et al.

(10) Patent No.: US 8,330,955 B2
(45) Date of Patent: Dec. 11, 2012

(54) COLOR DETECTOR

(75) Inventors: Stephan R. Clark, Albany, OR (US); Michael G. Monroe, Philomath, OR (US); Melinda M. Valencia, Corvallis, OR (US); Daniel A. Kearl, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 358 days.

(21) Appl. No.: 12/865,393

(22) PCT Filed: Feb. 12, 2008

(86) PCT No.: PCT/US2008/053721
§ 371 (c)(1),
(2), (4) Date: Jul. 29, 2010

(87) PCT Pub. No.: WO2009/102323
PCT Pub. Date: Aug. 20, 2009

(65) Prior Publication Data
US 2010/0328668 A1 Dec. 30, 2010

(51) Int. Cl.
*G01N 21/25* (2006.01)
(52) U.S. Cl. ....................................... 356/416
(58) Field of Classification Search .................. None
See application file for complete search history.

(56) References Cited

U.S. PATENT DOCUMENTS

| | | | |
|---|---|---|---|
| 5,144,498 A | 9/1992 | Vincent | |
| 5,272,518 A | 12/1993 | Vincent | |
| 5,359,615 A | 10/1994 | Sasaki et al. | |
| 5,428,635 A | 6/1995 | Zhiglinsky et al. | |
| 5,621,523 A | 4/1997 | Oobayashi et al. | |
| 5,786,893 A | 7/1998 | Fink et al. | |
| 5,850,623 A | 12/1998 | Carman et al. | |
| 5,999,259 A | 12/1999 | Atkinson et al. | |
| 6,011,623 A | 1/2000 | MacDonald et al. | |
| 6,141,136 A | 10/2000 | Kalibjian | |
| 6,256,328 B1 | 7/2001 | Delfyett et al. | |
| 6,349,156 B1 | 2/2002 | OsquoBrien et al. | |
| 6,380,531 B1 | 4/2002 | Sugihwo et al. | |
| 6,661,816 B2 | 12/2003 | Delfyett et al. | |
| 6,912,052 B2 | 6/2005 | Rao et al. | |
| 7,009,716 B2 | 3/2006 | Kim et al. | |
| 7,292,343 B2 | 11/2007 | Rao et al. | |
| 7,521,666 B2 * | 4/2009 | Tsang | 250/226 |
| 7,811,725 B2 * | 10/2010 | Chen et al. | 430/7 |
| 2001/0036209 A1 | 11/2001 | Delfyett | |
| 2003/0235924 A1 | 12/2003 | Adams | |

(Continued)

FOREIGN PATENT DOCUMENTS

DE 102005062482 11/2006

(Continued)

*Primary Examiner* — Tu Nguyen

(57) ABSTRACT

A color detector includes a light source, a photodiode, and a filter tuned to only allow light of a specific color to pass through to the photodiode. When the light reaches the photodiode, the photodiode outputs a current that indicates that the color is present in the light. The filter may include a pair of partially reflective layers consisting of a reflective metal, such as silver. To prevent the metal from oxidizing or reacting with the environment, the partially reflective layers may be coated with a protective layer, such as aluminum nitride. The color detector may further include a color enhancing layer. Finally, the color detector may include a capping layer. Accordingly, the color detector provided herein allows for the filter to use metals for partially reflective layers that would normally oxidize, as well as detect light of a specific spectrum of wavelengths.

20 Claims, 2 Drawing Sheets

U.S. PATENT DOCUMENTS

| | | |
|---|---|---|
| 2004/0223882 A1 | 11/2004 | Rhodes |
| 2005/0046856 A1 | 3/2005 | Rao et al. |
| 2005/0046868 A1 | 3/2005 | Kim et al. |
| 2005/0101026 A1 | 5/2005 | Sohn |
| 2005/0142035 A1 | 6/2005 | Shiffer |
| 2005/0174576 A1 | 8/2005 | Rao et al. |
| 2006/0144335 A1 | 7/2006 | Streater |
| 2006/0198404 A1 | 9/2006 | Henrichs |
| 2007/0217045 A1* | 9/2007 | Chen et al. .................... 359/891 |

FOREIGN PATENT DOCUMENTS

| | | |
|---|---|---|
| EP | 0442738 A3 | 9/1990 |
| EP | 0415401 B1 | 3/1991 |
| EP | 0552539 B1 | 7/1993 |
| EP | 0560006 B1 | 9/1993 |
| EP | 0586146 A1 | 3/1994 |
| EP | 0491131 B1 | 7/1995 |
| EP | 0745658 A1 | 12/1996 |
| EP | 0876609 B1 | 11/1998 |
| EP | 0964536 A2 | 12/1999 |
| EP | 0992093 B1 | 5/2003 |
| GB | 02387961 A | 10/2003 |
| GB | 2399875 A1 | 9/2004 |
| GB | 2421738 A | 7/2006 |
| JP | 57042824 | 3/1982 |
| JP | 1982-184937 | 11/1982 |
| JP | 1989-300202 | 12/1989 |
| JP | 01066458 | 3/2001 |
| JP | 03204111 | 7/2003 |
| JP | 03264339 | 9/2003 |
| JP | 03309319 | 10/2003 |
| JP | 04119721 | 4/2004 |
| JP | 04179278 | 6/2004 |
| JP | 04200685 | 7/2004 |
| JP | 05274507 | 10/2005 |
| JP | 06242817 | 9/2006 |
| JP | 2007-219483 | 8/2007 |
| WO | WO94/24545 A1 | 2/1994 |
| WO | WO 98/41825 | 9/1998 |
| WO | WO99/36788 A1 | 7/1999 |
| WO | WO 00/20844 | 4/2000 |
| WO | WO 2004/063681 A2 | 7/2004 |
| WO | WO 2005/068981 A2 | 7/2005 |
| WO | WO 2006/020702 A2 | 2/2006 |
| WO | WO 2007/027196 A3 | 3/2007 |

* cited by examiner

COLOR DETECTOR

BACKGROUND

Spectrophotometry is the study of electromagnetic waves in the visible, near-ultraviolet, and near-infrared spectra. A spectrophotometer is a light measuring device that is configured to measure various characteristics of light, including intensity, color, and/or wavelength. Spectrophotometers have a wide range of uses. For instance, they may be used to detect colors on display devices such as televisions, projectors, monitors, and camcorder viewfinders. Alternatively, spectrophotometers may be used in printing devices to calibrate the colors printed.

Typically, when used as a color detector, the spectrophotometer may include a light source, a light collector, such as a photodiode, and a filter. In one instance, the light is projected toward an object. The object reflects the light, and the photodiode receives the reflected light. The light may pass through the filter before being received by the photodiode so that the color may be detected. Specifically, the filter is configured to only allow light having a specific range of wavelengths to pass through. Light that passes through generates current in the photodiode. This current indicates that the specific color of light is present. An array of photodiodes and filters allow for the spectrophotometer to receive more detailed information. For example, an array of 20 photodiodes each having a filter tuned/designed to filter light at different wavelengths would be able to discriminate between more colors than a system with fewer photodiodes.

While useful in many technology areas, spectrophotometers have several problems. For instance, the filter may include two metal films. However, the metal film may begin to oxidize after being exposed to air. The oxidization of the metal film reduces the net internal reflectance from the metal coating altering the performance of the filter as it degrades. The main effect of the reflectance degradation is to widen the bandwidth of the filter for a given transmission peak of the filter. This will reduce the color discrimination of the filter array as the filters overlap one another more in wavelength. Another problem for Silicon based photodiode systems is that certain wavelengths of light are difficult to detect. This is especially true for the blue region of the color spectrum. In order to compensate for this, some spectrophotometers amplify these colors electrically with an amplifier in order to make them more easily detectible; however, the amplifier also amplifies noise received by the sensor. The increased noise may lead to inaccurate readings by the light collector.

Accordingly, a spectrophotometer or color detector is needed having an improved filter and/or allow for color amplification without amplifying noise.

DETAILED DESCRIPTION

A color detector includes a light source, a photodiode, and a filter disposed between the light source and the photodiode. The filter is tuned to only allow light having a specific spectrum of wavelengths to pass through to the photodiode. When the light reaches the photodiode, the photodiode outputs a current. The current indicates the presence of the color in the specific spectrum of wavelengths. Multiple color detectors may be arranged in an array to indicate the presence of multiple colors by reading the detector output directly, or alternately, the outputs of the multiple color detectors arranged in an array may be used in conjunction with a suitable color conversion algorithm to determine the input color. The filter may include a pair of partially reflective layers coated in a reflective metal, such as silver. To prevent the metal from oxidizing or reacting with the environment, the reflective layers may be coated with a protective layer, such as aluminum nitride. The color detector may further include color enhancing layers having a typical high-low index material combination, thereby maximizing the transmission of a wavelength region of interest. The choice of thickness of the high-low index material combination effect the wavelength region of the maximization. Finally, the color detector may include a capping layer that will tend to flatten or equalize the peak transmission of the filter across a given array of color detectors that have been tuned/designed to cover a given spectral band. Accordingly, the color detector provided herein allows for the filter to use metals for partially reflective layers that would normally oxidize or degrade, as well as maximize the detected light of a specific spectrum of wavelengths.

In one exemplary approach, the color detector may be used with a printer to calibrate colors printed on a page. Specifically, the color detector may detect the color of the page, and the printer may be configured to eject different amounts of ink for different colors of paper. For example, if yellow ink is desired, but the page is blue, yellow ink will not appear the yellow color intended on the page. Therefore, the color detector detects the color of the page and configures the printer to eject the ink so that the desired color is shown on the page.

Figure 1:
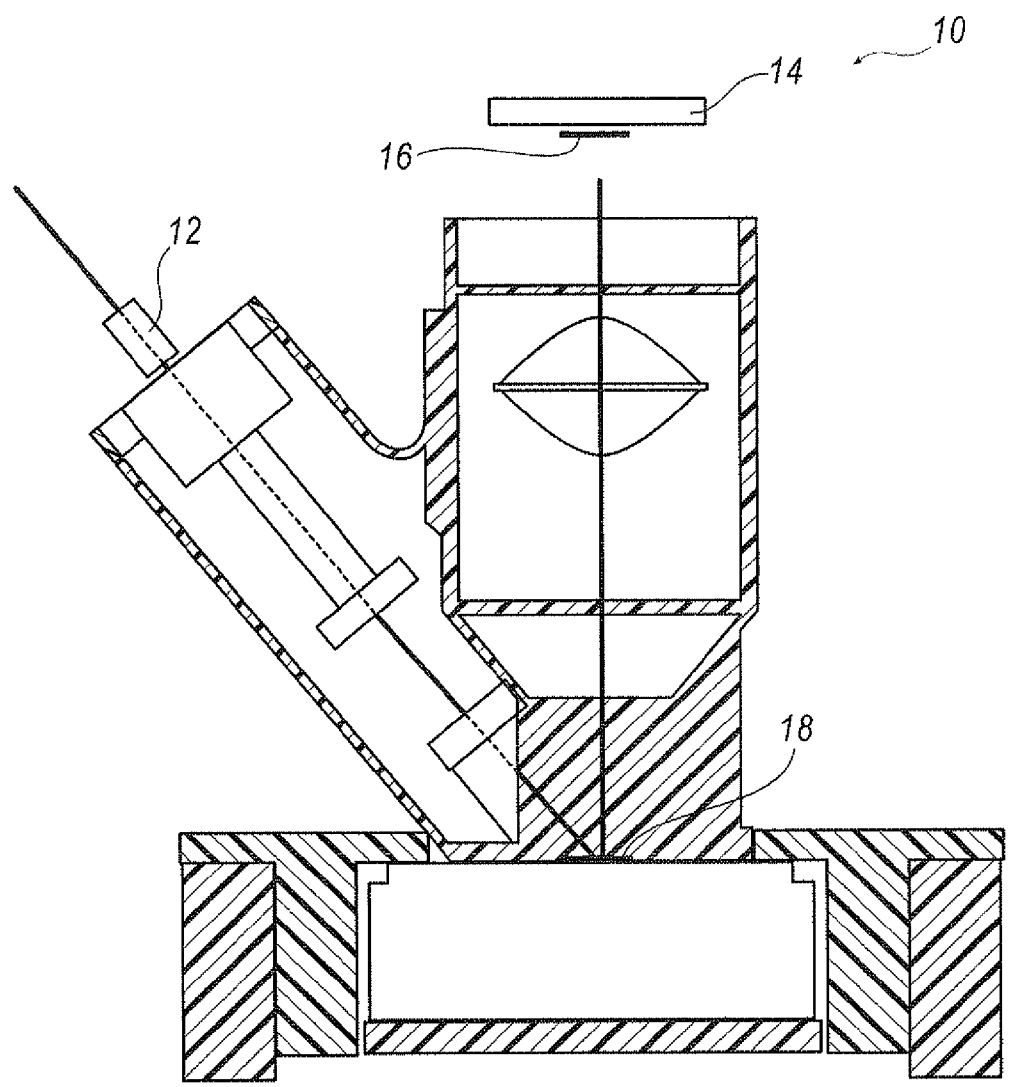
FIG. 1 is cross-sectional side view of an exemplary color detector.

Referring to FIG. 1, an exemplary color detector 10 is provided having a light source 12, a photodiode 14 in optical communication with the light source 12, and a filter 16 made integrally on top photodiode 14. In an example of a calibration use, the light source 12 projects light onto a sample 18. The light source 12 may be, for instance, a light emitting diode, although other light sources 12 are within the scope of the disclosure. The sample 18 may be, for instance, a piece of paper, although other samples 18 are within the scope of the disclosure. The light projected onto the sample 18 is reflected by the sample 18 onto the photodiode 14. However, before reaching the photodiode 14, in one exemplary approach, the light passes through the filter 16. The filter 16 may be a Fabry-Perot etalon or any other filter 16 known in the art. In one exemplary approach, the filter 16 may be tuned to only allow light having a specific spectrum of wavelengths to pass through to the photodiode 14, as will be discussed in greater detail below. Once received by the photodiode 14, the photodiode 14 outputs a current. The presence of the current is indicative of a color in the specific spectrum of wavelengths.

Multiple filters 16 may be used with the color detector 10, and each filter 16 may be tuned to a unique specific spectrum of wavelengths. In one exemplary approach, the specific spectrum of wavelengths of each filter 16 may at least partially overlap. Furthermore, when multiple filters 16 are used, the color detector 10 may include multiple photodiodes 14—at least one for each filter 16. In one exemplary approach, the color detector 10 may include seven filters 16 and seven photodiodes 14. Each filter 16 may be tuned to allow different colors to pass through to the corresponding photodiode 14.

By way of example, the filters 16 may be configured to detect wavelength spectrums corresponding to "red," "orange," "yellow," "green," "blue," "indigo," and "violet." If the sample 18 is in the "red" spectrum, the light will only pass through the filter 16 admitting wavelengths corresponding to the "red" spectrum, and be blocked by the other filters 16. Therefore, only the photodiode 14 corresponding to the "red" filter 16 will output a current, indicating the presence of a color in the "red" spectrum. Similarly, if the sample 18 is "green," the light will only pass through the filter 16 admitting wavelengths corresponding to the "green" spectrum, and be blocked by the other filters 16. Therefore, only the photodiode 14 corresponding to the "green" filter 16 will output a current, indicating the presence of a color in the "green" spectrum. Using more filters 16 and corresponding photodiodes 14 allows the color detector 10 to distinguish between varying hues of color. For instance, with additional filters 16 and corresponding photodiodes 14, the color detector 10 may be able to distinguish between "baby blue," "sky blue," and "navy blue," as opposed to just recognizing the color as being in the "blue" spectrum.

Figure 2:
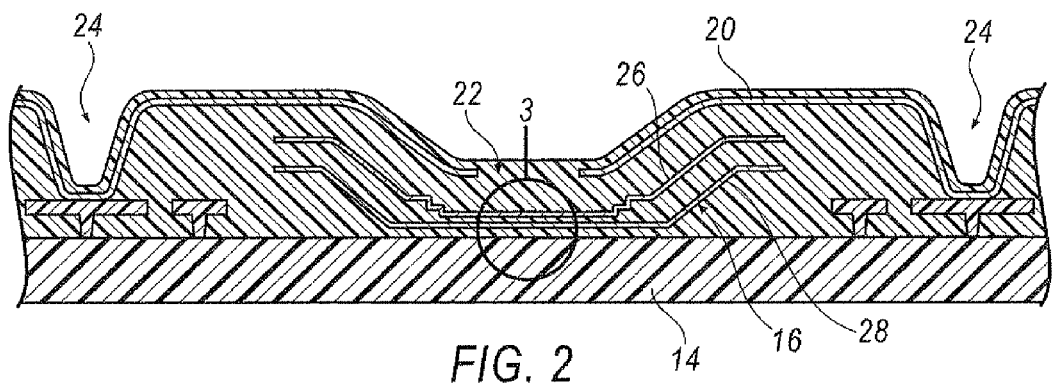
FIG. 2 is a cross-sectional side view of an exemplary filter disposed on an exemplary photodiode.

FIG. 2 is an exemplary cross-sectional illustration of the filter 16 disposed on the photodiode 14 in the color detector 10. As previously discussed, the filter 16 and corresponding photodiode 14 may be used in an array with other filters 16 and photodiodes 14. However, light may reflect off one filter 16 and interfere with other photodiodes 14 in the array. Therefore, the color detector 10 may include a dark layer 20 defining an opening 22. Light passes through the opening 22 before passing through the filter 16, and the dark layer 20 prevents light from reflecting off the filter 16 and interfering with photodiodes 14 corresponding to other filters 16. Similarly, the color detector 10 may include at least one trench 24 that also prevents light from reflecting and interfering with other photodiodes 14.

In one exemplary approach, the filter 16 may include a first partially reflective layer 26 spaced from a second partially reflective layer 28. A spacer layer 30 formed from, for example silicon dioxide, may be disposed between the first partially reflective layer 26 and the second partially reflective layer 28. The spacer layer 30 may alternatively be formed from other materials. This type of filter 16 may be known in the art as a Fabry-Perot etalon or Fabry-Perot interferometer, although other types of filters 16 may be used. Light may pass through one of the partially reflective layers and is reflected between the two partially reflective layers. As illustrated, light may pass through the first partially reflective layer 26 and reflect between the first partially reflective layer 26 and the second partially reflective layer 28. This is known as internal reflection. If the internal reflections are in phase (i.e., constructive), the light will pass through the filter 16. If the internal reflections are out of phase (i.e., destructive), the light waves will tend to cancel each other out, and result in little or no light passing through the filter 16. Whether the internal reflections are constructive or destructive depends on the wavelength of the light (i.e., the color), the angle of the light entering the filter 16, the thickness of the spacer layer 30, and the refractive index of the spacer layer 30. As previously discussed, the color of the light is dependent upon the color of the sample 18. However, the angle of the light entering the filter 16, the thickness of the spacer layer 30, and the refractive index of the material making up the spacer layer 30 may be adjusted to allow light in a specific spectrum of wavelengths to pass through.

Figure 3:
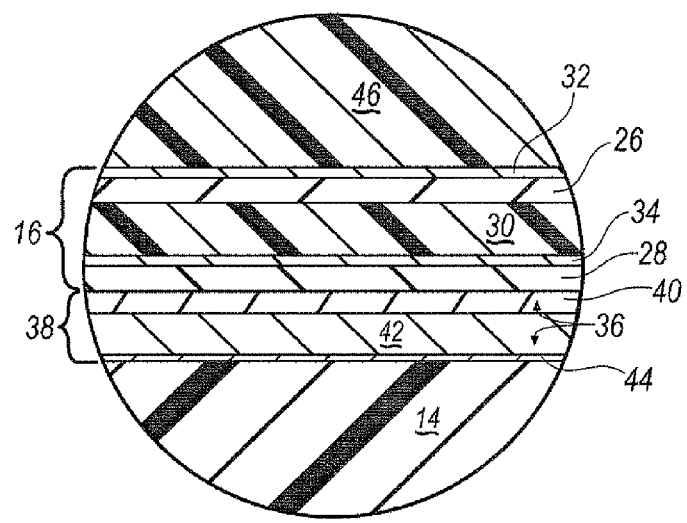
FIG. 3 is a magnified, cross-sectional side view illustrating layers of the filter disposed on the photodiode.

FIG. 3 is an exemplary cross-sectional view of the filter 16 disposed on the photodiode 14. In one exemplary approach, the first partially reflective layer 26 and the second partially reflective layer 28 may be formed from silver. The first partially reflective layer 26 may be coated with a first protective layer 32 to help prevent the first partially reflective 26 from oxidizing or degrading. Accordingly, the second partially reflective layer 28 may be coated with a second protective layer 34 to prevent the second partially reflective layer 28 from oxidizing or degrading. In one exemplary approach, the first protective layer 32 and the second protective layer 34 are formed from aluminum nitride.

The color detector 10 may further include a color enhancer 36 disposed between the photodiode 14 and the filter 16. The color enhancer 36 may be used to reduce the absorption and reflectance profiles of the coating thereby maximizing the transmission of the filter for colors in specific color spectrums. For instance, colors in the "blue" spectrum may be partially absorbed by certain materials, making it difficult for the color detector 10 to detect colors in that spectrum. The "blue" spectrum is merely exemplary and the color enhancer 36 may be used to enhance transmission of colors in other spectrums. In one exemplary approach, the color enhancer 36 may include a high-low index material combination 38 that is designed to maximize the transmission of the filter disposed on the photodiode 14. In one exemplary approach, the color enhancing layer 38 may be formed from a combination of silicon dioxide and silicon nitride, although the color enhancing layer 38 may be formed from other materials. The color enhancing layer 38 may include a first color enhancing layer 40 and a second color enhancing layer 42 disposed on a low index material 44 such as silicon dioxide directly on top photodiode 14. The first color enhancing layer 40 may be formed from aluminum nitride, although the first color enhancing layer 40 may be formed from other materials. In one exemplary approach, the second color enhancing layer 42 is disposed on the second partially reflective layer 28. In this example, the second color enhancing layer 42 may be formed from silicon nitride, although the second color enhancing layer 42 may be formed from other materials. When the first color enhancing layer 40 is formed from aluminum nitride, the first color enhancing layer 40 may also help prevent degradation effects from the second partially reflective layer 28, as well as act as a color enhancing layer. The color enhancer 36 may further include a cover layer 44 disposed between the photodiode 14 and the color enhancing layer 38. Specifically, the cover layer 44 may be disposed between the photodiode 14 and the second color enhancing layer 42. In one exemplary approach, the cover layer 44 may be formed from silicon dioxide.

Furthermore, the color detector 10 may include a capping layer 46 disposed on the first protective layer 32. In one exemplary approach, the capping layer 46 is formed from silicon dioxide, although the capping layer 46 may be formed from another material. The capping layer 46 may be used to help equalize or flatten the peak transmission of the various filters in the photodiode array. Specifically, the thickness of the capping layer 46 may help tune the filter 16. In one exemplary approach, the capping layer 46 is formed from a dielectric material, the thickness of which allows the filter 16 to be tuned in a specific region to have a spectral flattening effect on the filters 16.

It is to be understood that the above description is intended to be illustrative and not restrictive. Many embodiments and applications other than the examples provided would be apparent to those skilled in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

We claim:

1. A color detector comprising:
   a light source;
   a photodiode in optical communication with said light source;
   a filter integrally formed on said photodiode, wherein said filter includes a first partially reflective layer spaced from a second partially reflective layer and a spacer layer disposed therebetween; and
   a color enhancer disposed between said photodiode and said filter.

2. A color detector as set forth in claim 1, wherein said first partially reflective layer and said second partially reflective layer are formed from silver.

3. A color detector as set forth in claim 1, further comprising a first protective layer disposed on said first partially reflective layer and a second protective layer disposed on said second partially reflective layer.

4. A color detector as set forth in claim 3, wherein the first protective layer and the second protective layer are formed from aluminum nitride.

5. A color detector as set forth in claim 3, further comprising a capping layer disposed on said first protective layer.

6. A color detector as set forth in claim 5, wherein said capping layer is formed from silicon dioxide.

7. A color detector as set forth in claim 1, wherein said color enhancer includes a color enhancing layer disposed on said photodiode and said second partially reflective layer of said filter.

8. A color detector as set forth in claim 7, wherein said color enhancing layer includes a first color enhancing layer and a second color enhancing layer disposed on said first color enhancing layer, and wherein said second color enhancing layer is disposed on said second partially reflective layer.

9. A color detector as set forth in claim 8, wherein said first color enhancing layer is formed from aluminum nitride and said second color enhancing layer is formed from silicon nitride.

10. A color detector as set forth in claim 1, wherein said color enhancing layer is formed from silicon nitride.

11. A color detector as set forth in claim 1, wherein said color enhancer includes a cover layer disposed on said photodiode.

12. A color detector as set forth in claim 11, wherein said cover layer is formed from silicon dioxide.

13. A color detector as set forth in claim 1, wherein the spacer layer is formed from silicon dioxide.

14. A color filter comprising:
    a first partially reflective layer;
    a second partially reflective layer spaced from said first partially reflective layer;
    a spacer layer disposed between said first partially reflective layer and said second partially reflective layer; and wherein said first reflective layer and said second partially reflective layer are formed from silver; and
    a first protective layer disposed on said first partially reflective layer and a second protective layer disposed on said second partially reflective layer, wherein the first protective layer and the second protective layer are formed from aluminum nitride.

15. A color filter as set forth in claim 14, wherein said spacer layer is formed from silicon dioxide.

16. A color filter as set forth in claim 14, further comprising a capping layer disposed on said first protective layer.

17. A color filter as set forth in claim 16, wherein said capping layer is formed from silicon dioxide.

18. A color enhancer comprising:
    a substrate having a first color enhancing layer and a second color enhancing layer; and
    a cover layer disposed on said second color enhancing layer, wherein said first color enhancing layer is formed from silicon nitride and said second color enhancing layer is formed from aluminum nitride.

19. A color enhancer as set forth in claim 18, wherein said cover layer is disposed on said second color enhancing layer.

20. A color enhancer as set forth in claim 18, wherein said cover layer is formed from silicon dioxide.

* * * * *

UNITED STATES PATENT AND TRADEMARK OFFICE
CERTIFICATE OF CORRECTION

PATENT NO. : 8,330,955 B2  
APPLICATION NO. : 12/865393  
DATED : December 11, 2012  
INVENTOR(S) : Stephan R. Clark et al.

Page 1 of 1

It is certified that error appears in the above-identified patent and that said Letters Patent is hereby corrected as shown below:

In the Claims

In column 6, lines 1-2, in Claim 8, delete "enhancing," and insert -- enhancing --, therefor.

Signed and Sealed this  
Fourteenth Day of May, 2013

Teresa Stanek Rea  
*Acting Director of the United States Patent and Trademark Office*